United States Patent
Chang et al.

(10) Patent No.: US 7,473,517 B2
(45) Date of Patent: Jan. 6, 2009

(54) SUPERCRITICAL DEVELOPING FOR A LITHOGRAPHIC PROCESS

(75) Inventors: Ching-Yu Chang, Yilang (TW); Burn Jeng Lin, Hsin-Chu (TW); Chi-Wen Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 523 days.

(21) Appl. No.: 11/025,538

(22) Filed: Dec. 29, 2004

(65) Prior Publication Data

US 2006/0141399 A1    Jun. 29, 2006

(51) Int. Cl.
G03F 7/30    (2006.01)
(52) U.S. Cl. ..................... 430/311; 430/331
(58) Field of Classification Search ........... 430/311, 430/329, 331
See application file for complete search history.

(56) References Cited

U.S. PATENT DOCUMENTS

| | | | |
|---|---|---|---|
| 6,509,141 B2 | 1/2003 | Mullee | |
| 6,556,280 B1 | 4/2003 | Kelsey et al. | |
| 6,565,764 B2 | 5/2003 | Hiraoka et al. | |
| 6,656,666 B2 | 12/2003 | Simons et al. | |
| 6,713,236 B2 | 3/2004 | Chen | |
| 6,781,670 B2 | 8/2004 | Krautschik | |
| 6,788,477 B2 | 9/2004 | Lin | |
| 2003/0216269 A1* | 11/2003 | DeYoung et al. | 510/175 |
| 2004/0265747 A1 | 12/2004 | Medeiros et al. | |
| 2006/0003271 A1* | 1/2006 | Clark et al. | 430/329 |

OTHER PUBLICATIONS

Bok, Edward, et al., "Supercritical Fluids for Single Wafer Cleaning", Solid State Technology, Jun. 1992, pp. 117-120.
Hayduk, Eric, et al., "Characterization of Supercritical $CO_2$ Developable Photoresists for Non-Wetting Surfaces", National Nanofabrication Users Network, Research Accomplishments 1998, pp. 11-12.
Zhang, Xiaogang, et al., "Chemical-Mechanical Photoresist Drying in Supercritical Carbon Dioxide with Hydrocarbon Surfactants", J. Vac. Sci. Technol. B 22(2), Mar./Apr. 2004, pp. 818-825.

* cited by examiner

*Primary Examiner*—Kathleen Duda
(74) *Attorney, Agent, or Firm*—Haynes and Boone, LLP

(57) ABSTRACT

A method of creating a resist image on a semiconductor substrate includes exposing a layer of photoresist on the semiconductor substrate and developing the exposed layer of photoresist using a first fluid including supercritical carbon dioxide and a base such as Tetra-Methyl Ammonium Hydroxide (TMAH). Additionally, the developed photoresist can be cleaned using a second fluid including supercritical carbon dioxide and a solvent such as methanol, ethanol, isopropanol, and xylene.

23 Claims, 1 Drawing Sheet

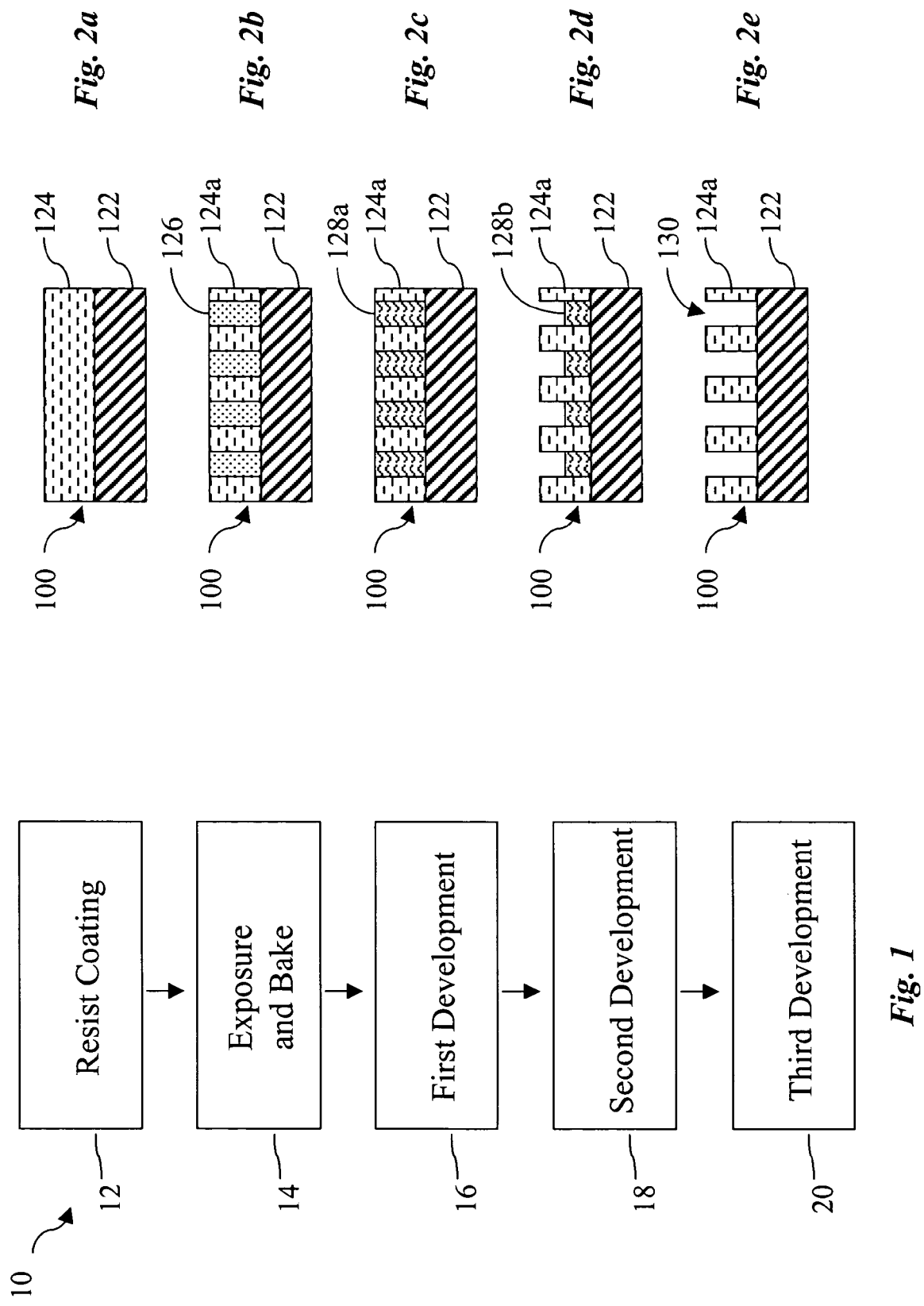

SUPERCRITICAL DEVELOPING FOR A LITHOGRAPHIC PROCESS

BACKGROUND

The present disclosure relates generally to photolithography, such as is used in the manufacture of semiconductor integrated circuits.

Photolithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Currently, CDs are reaching 65 nanometers and less.

Semiconductor photolithography typically includes the steps of applying a coating of photoresist on a top surface (e.g., a thin film stack) of a semiconductor wafer and exposing the photoresist to a pattern. A post-exposure bake is often performed to allow the exposed photoresist, often a polymer-based substance, to cleave. The cleaved polymer photoresist is then transferred to a developing chamber to remove the exposed polymer, which is soluble to an aqueous developer solution. Typically, a solution such as Tetra-Methyl Ammonium Hydroxide (TMAH) is applied to the resist surface in the form of a puddle. A de-ionized (DI) water rinse is then applied to remove the dissolved photoresist and a spin dry process is used to dry the wafer. The wafer can then be transferred to an additional baking process to remove any moisture on the resist surface or can be transferred to a next process operation. Once dried, only a patterned layer of photoresist exists on the top surface of the wafer.

Several problems often exist after the above described process, especially as advancements in semiconductor technology result in relatively thin (tight pattern density) and/or relatively tall (high aspect ratio) patterned layers of photoresist. One problem is that the photoresist is less solid and easily suffers from bending and/or collapse at development rinsing and drying steps due to excessive capillary forces between adjacent portions of photoresist. Other problems exist due to factors associated with the use of the TMAH, including an extended developing time and shrinkage of the photoresist upon exposure to the TMAH. Furthermore, the pH of TMAH is often not desirable for certain procedures and operations.

One solution that addresses the bending and/or collapse of photoresist is to add supercritical CO2 during the drying process, as disclosed in U.S. Pat. No. 6,656,666 and the article Zhang, et al., "Chemical-Mechanical Photoresist Drying In Supercritical Carbon Dioxide With Hydrocarbon Surfactants," J. Vac. Sci. Technol. B 22(2) p. 818 (2004), both of which are hereby incorporated by reference. However, this solution adds an additional processing material (the supercritical CO2) to the otherwise conventional process, requires a relatively long period of time, and does not alleviate the adverse effects of the capillary forces throughout the entire process.

It is desired to improve the lithographic process by reducing the effects of the capillary forces and by reducing the amount of steps and/or processing time and material required.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a flow chart of a method for implementing one or more embodiments of the present invention.

FIGS. 2a-2e are side cross sectional views of a semiconductor wafer that is being processed according to the method of FIG. 1.

DETAILED DESCRIPTION

The present disclosure relates generally to the fabrication of semiconductor devices, and more particularly, to a method and system for the removal of photoresist residue from a semiconductor substrate. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail.

Referring to the figures, for the sake of example, processing a substrate in the form of a semiconductor wafer will be described. It is understood that other examples of substrates and processes can benefit from the present invention, including printed circuit board substrates and damascene or dual damascene processes. FIG. 1 provides a flow chart of a method 10 for implanting one embodiment of the invention, and FIGS. 2a-2e show incremental changes of a semiconductor wafer 100 that correspond to each step of the flow chart.

Referring to FIG. 1, execution of the method 10 begins at step 12 where a resist coating is applied to the substrate. Referring to the example of FIG. 2a, the semiconductor wafer 100 includes a substrate 122 that receives a layer of photoresist 124. The substrate 122 may include a plurality of films, such as a thin film stack, and the photoresist 124 is a conventional hydrophobic or hydrophilic polymer resist applied using conventional techniques. One example of a photoresist is commercially referred to as 193PR.

At step 14, an exposure operation and a post-exposure bake operation may be performed. Referring to FIG. 2b, the photoresist is pattered to include unexposed portions 124a and exposed portions 126. It is understood that many different types of photoresist can be used, and that for the sake of example a positive photoresist is herein discussed. In many facilities, there can be a separate exposure system and post-exposure baking system.

At step 16, a first development process is performed on the substrate. Referring to FIG. 2c, the first development process can be used to begin the removal of the exposed portions of the photoresist, identified now with the reference numeral 128a. In one embodiment, a fluid used in the first development process is a supercritical fluid that includes at least one of each of the following constituents: supercritical carbon dioxide $CO_2$, de-ionized (DI) water ($H_2O$), and a base co-solvent (pH larger than 7). Supercritical $CO_2$ is preferred for having low viscosity, high diffusivity, and low surface tension. $CO_2$ also has excellent environmental, safety, and cost considerations. The base can comprise TMAH or some other basic material (e.g., a hydroxide OH—). The base co-solvent operates to change the resist polymer 128a from a non-polar structure to an ionic and water-soluble structure. The supercritical $CO_2$ plus base co-solvent provide high penetration into the resist 128a to get a better wettability and developing uniformity, typically within 1 to 5 seconds. After the first development process has been completed, the substrate can be emerged into a liquid, if needed.

At step 18, a second development process is performed on the substrate. Referring to FIG. 2d, the second development process can be used to further remove the exposed portions of the photoresist, which is now a water-soluble resist 128b due to the treatment by the base (e.g., the TMAH). In one embodiment, a fluid used in the second development process is a supercritical fluid that includes at least one of each of the following constituents: supercritical carbon dioxide and de-ionized water. In another embodiment, a fluid used in the second development process includes at least one of each of the following constituents: de-ionized water and surfactant. After the second development process has been completed, the substrate can be emerged into a liquid, if needed.

At step 20, a third development process is performed on the substrate. Referring to FIG. 2e, the third development process can be used to finally remove any remaining portions of exposed photoresist and liquid. As a result, gaps 130 are left in the photoresist 124, thereby creating the mask pattern on the substrate 122. In one embodiment, a fluid used in the third development process is a supercritical fluid that includes carbon dioxide. In some embodiments, a solvent such as alcohol (e.g., methanol, ethanol, isopropanol (IPA), and/or xylene) can also be used with the supercritical CO2.

It is understood that although three development processes are shown, other embodiments may have more or fewer processes, as required. For example, in another embodiment, the second development process 18 can be omitted.

The present embodiments include many advantages. For one, if TMAH is used in the first development 16, the TMAH combined with the supercritical CO2 will penetrate into the resist within a few seconds. The high efficiency of the supercritical CO2 facilitates the reaction of the exposed area of the polymer photoresist with the TMAH base to become hydrophilic and water soluble. Also, the inclusion of the supercritical CO2 prevents any pH shock that typically occurs with TMAH. The super critical developing can penetrate its base molecular into the resist without any difference between hydrophobic and hydrophilic resist. Therefore, this process does not need to pre-wet or add a surfactant inside the developer, although these steps can be used if so desired.

This process provides an improvement over the conventional wet puddle TMAH process, since the wet puddle process cannot apply a good wettability on a small pattern area. The wafer critical dimension (CD) is relative to TMAH puddle time. Due to the different wettability for different pattern densities, the actual exposed pattern puddle time may also be different. Such difference finally induces CD bias. Furthermore, the present embodiment does not shrink the CD of the pattern because of the reduced TMAH-induced bias. Therefore, the wafer CD uniformity can be tightened without any center/edge bias, wafer edge bias, or wafer-to-wafer bias.

Another advantage is that no separate de-ionized (DI) water rinse is required. Even without DI rinse, there is no photoresist scum or residue inside any deep hole/trench patterns.

Yet another advantage is that if the fluid for the second development process 18 includes distilled water after the TMAH developing (either using the first development process 16 discussed above or using a conventional method), the supercritical CO2 and the de-ionized water process can remove the exposed polymer with a good selectivity. Furthermore, the second development process 18 using supercritical CO2 and DI water can remove the developed polymer without any watermark, defect, or pattern collapse.

Another advantage is that if the third development process 20 fluid can (in some embodiments) only include supercritical CO2. The supercritical CO2 process can remove any moisture on the wafer surface and produce a clean surface without any watermark, defect or pattern collapse.

Still another advantage is that the supercritical CO2 can be used at any step of the developing process, including the first development step 16 for polymer developing, the second development step 18 for polymer removing, and the third development step 20 for moisture removing. By combining one or more steps using supercritical CO2, an improvement in efficiency, cleanness and performance can be achieved. An overall development time of less than 10 seconds can therefore be obtained.

In summary, the present invention provides supercritical processing for use in a lithographic process. In one embodiment of a method of creating a resist image on a semiconductor substrate includes exposing a layer of photoresist on the semiconductor substrate and developing the exposed layer of photoresist using a first fluid including supercritical carbon dioxide and a base such as Tetra-Methyl Ammonium Hydroxide (TMAH) of a hydroxide (OH—). In some embodiments, the developed photoresist can be cleaned using a second fluid including supercritical carbon dioxide and a solvent such as methanol, ethanol, isopropanol, and xylene.

In some embodiments, the method also includes processing the developed photoresist using a third fluid of supercritical carbon dioxide prior to cleaning. The third fluid can include water, such as de-ionized water.

In another embodiment, a method of creating a resist image on a semiconductor substrate includes exposing a layer of photoresist on the semiconductor substrate and performing first and second processes on the exposed layer of photoresist. The first process uses a first supercritical fluid including a constituent having a low surface tension and a constituent with properties for converting the exposed layer into a water-soluble layer. In some embodiments, the second process uses a third supercritical fluid including a constituent having a low surface tension and water. In other embodiments, the second process uses a fluid including at least one of either water or surfactant.

In some embodiments, a third process is also used. The third process uses a fourth supercritical fluid including a constituent having a low surface tension but without water.

Although only a few exemplary embodiments of this invention have been described in detail above, those skilled in the art will readily appreciate that many modifications are possible in the exemplary embodiments without materially departing from the novel teachings and advantages of this invention. Also, features illustrated and discussed above with respect to some embodiments can be combined with features illustrated and discussed above with respect to other embodiments. Accordingly, all such modifications are intended to be included within the scope of this invention.

We claim:

1. A method of creating a resist image on a semiconductor substrate, comprising:

exposing a layer of photoresist on the semiconductor substrate;

developing the exposed layer of photoresist using a fluid including supercritical carbon dioxide and a base.

2. The method of claim 1 wherein the base includes Tetra-Methyl Ammonium Hydroxide (TMAH).

3. The method of claim 1 wherein the base includes a hydroxide (OH—).

4. The method of claim 1 wherein the fluid includes water.

5. A method of creating a resist image on a semiconductor substrate, comprising:
exposing a layer of photoresist on the semiconductor substrate;
developing the exposed layer of photoresist using a first fluid including supercritical carbon dioxide and a base; and
cleaning the developed photoresist using a second fluid including supercritical carbon dioxide.

6. The method of claim 5 wherein the base is Tetra-Methyl Ammonium Hydroxide (TMAH).

7. The method of claim 5 wherein the base includes a hydroxide (OH—).

8. The method of claim 5 wherein the first fluid includes water.

9. The method of claim 5 wherein the second fluid includes a solvent.

10. The method of claim 5 wherein the solvent includes an alcohol selected from the group consisting of methanol, ethanol, isopropanol, and xylene.

11. The method of claim 5 further comprising:
processing the developed photoresist using a third fluid of supercritical carbon dioxide prior to cleaning.

12. The method of claim 11 wherein the third fluid includes de-ionized water.

13. A method of creating a resist image on a semiconductor substrate, comprising:
exposing a layer of photoresist on the semiconductor substrate;
performing a first process on the exposed layer of photoresist using a first supercritical fluid including a constituent having a low surface tension and a constituent with properties for converting the exposed layer into a water-soluble layer; and
performing a second process on the water-soluble layer of photoresist using a second supercritical fluid including a constituent having a low surface tension and water.

14. The method of claim 13 further comprising:
performing a third process on the water-soluble layer of photoresist using a third supercritical fluid including a constituent having a low surface tension but not including water.

15. The method of claim 13 wherein the constituent having a low surface tension is supercritical carbon dioxide.

16. The method of claim 13 wherein the constituent with properties for converting the exposed layer into a water-soluble layer has a basic pH.

17. The method of claim 16 wherein the constituent with properties for converting the exposed layer into a water-soluble layer is Tetra-Methyl Ammonium Hydroxide (TMAH).

18. A method of creating a resist image on a semiconductor substrate, comprising:
exposing a layer of photoresist on the semiconductor substrate;
performing a first process on the exposed layer of photoresist using a first supercritical fluid including a constituent having a low surface tension and a constituent with properties for converting the exposed layer into a water-soluble layer; and
performing a second process on the water-soluble layer of photoresist using a fluid including at least one of water or surfactant.

19. The method of claim 18 further comprising:
performing a third process on the semiconductor substrate using a spin drying process to drying the substrate.

20. The method of claim 18 further comprising:
performing a third process on the water-soluble layer of photoresist using a second supercritical fluid including a constituent having a low surface tension but not including water.

21. The method of claim 20 wherein the constituent having a low surface tension is supercritical carbon dioxide.

22. The method of claim 18 wherein the constituent with properties for converting the exposed layer into a water-soluble layer has a basic pH.

23. The method of claim 18 wherein the constituent with properties for converting the exposed layer into a water-soluble layer is Tetra-Methyl Ammonium Hydroxide (TMAH).

* * * * *